(12) United States Patent
Zhang et al.

(10) Patent No.: US 11,762,700 B2
(45) Date of Patent: Sep. 19, 2023

(54) HIGH-ENERGY-EFFICIENCY BINARY NEURAL NETWORK ACCELERATOR APPLICABLE TO ARTIFICIAL INTELLIGENCE INTERNET OF THINGS

(71) Applicant: SHANGHAITECH UNIVERSITY, Shanghai (CN)

(72) Inventors: Hongtu Zhang, Shanghai (CN); Yuhao Shu, Shanghai (CN); Yajun Ha, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 0 days.

(21) Appl. No.: 18/098,746

(22) Filed: Jan. 19, 2023

(65) Prior Publication Data

US 2023/0161627 A1 May 25, 2023

Related U.S. Application Data

(63) Continuation of application No. PCT/CN2022/110406, filed on Aug. 5, 2022.

(30) Foreign Application Priority Data

Oct. 8, 2021 (CN) .......................... 202111169933.X

(51) Int. Cl.
*G06F 9/50* (2006.01)
*G06F 7/50* (2006.01)
(Continued)

(52) U.S. Cl.
CPC .............. *G06F 9/5027* (2013.01); *G06F 7/50* (2013.01); *G06F 7/523* (2013.01); *H03K 19/21* (2013.01)

(58) Field of Classification Search
CPC .......... G06F 9/5027; G06F 7/50; G06F 7/523; H03K 19/21
See application file for complete search history.

(56) References Cited

U.S. PATENT DOCUMENTS

2019/0156723 A1* 5/2019 Dai ...................... G09G 3/3677
2020/0097807 A1* 3/2020 Knag ..................... G06N 3/045
(Continued)

FOREIGN PATENT DOCUMENTS

CN 110070182 A 7/2019
CN 110288510 A 9/2019
(Continued)

OTHER PUBLICATIONS

Zheyu Liu, et al., NS-CIM: A Current-Mode Computation-in-Memory Architecture Enabling Near-Sensor Processing for Intelligent IoT Vision Nodes, IEEE Transactions on Circuits and Systems—I: Regular Papers, 2020, pp. 2909-2922, vol. 67, No. 9.
(Continued)

*Primary Examiner* — Zachary K Huson
(74) *Attorney, Agent, or Firm* — Bayramoglu Law Offices LLC

(57) ABSTRACT

A high-energy-efficiency binary neural network accelerator applicable to artificial intelligence Internet of Things is provided. 0.3-0.6V sub/near threshold 10T1C multiplication bit units with series capacitors are configured for charge domain binary convolution. An anti-process deviation differential voltage amplification array between bit lines and DACs is configured for robust pre-amplification in 0.3V batch standardized operations. A lazy bit line reset scheme further reduces energy, and inference accuracy losses can be ignored. Therefore, a binary neural network accelerator chip based on in-memory computation achieves peak energy efficiency of 18.5 POPS/W and 6.06 POPS/W, which are
(Continued)

respectively improved by 21× and 135× compared with previous macro and system work [9, 11].

9 Claims, 12 Drawing Sheets

(51) Int. Cl.
*G06F 7/523* (2006.01)
*H03K 19/21* (2006.01)

(56) References Cited

U.S. PATENT DOCUMENTS

2020/0293867 A1  9/2020  Shao et al.
2021/0256357 A1* 8/2021  Najafi ............... G06N 3/047

FOREIGN PATENT DOCUMENTS

| CN | 111047031 A | 4/2020 |
| CN | 112445456 A | 3/2021 |
| CN | 112784971 A | 5/2021 |
| CN | 113935479 A | 1/2022 |
| EP | 3671748 A1  | 6/2020 |

OTHER PUBLICATIONS

Alfio Di Mauro, et al., Always-On 674μW@4GOP/s Error Resilient Binary Neural Networks With Aggressive SRAM Voltage Scaling on a 22-nm IoT End-Node, IEEE Transactions on Circuits and Systems—I: Regular Papers, 2020, pp. 1-14.
Matthieu Courbariaux, et al., Binarized Neural Networks: Training Neural Networks with Weights and Activations Constrained to +1 or −1, arXiv:1602.02830v3, 2016.
Bert Moons, et al., Minimum Energy Quantized Neural Networks, Asilomar, 2017, pp. 1921-1925.
Shixuan Zheng, et al., An Ultra-Low Power Binarized Convolutional Neural Network-Based Speech Recognition Processor With On-Chip Self-Learning, IEEE Transactions on Circuits and Systems—I: Regular Papers, 2019, pp. 1-14.
Yixing Li, et al., A 34-FPS 698-GOP/s/W Binarized Deep Neural Network-based Natural Scene Text Interpretation Accelerator for Mobile Edge Computing, IEEE Transactions on Industrial Electronics, 2018.
Minsuk Koo, et al., sBSNN: Stochastic-Bits Enabled Binary Spiking Neural Network With On-Chip Learning for Energy Efficient Neuromorphic Computing at the Edge, IEEE Transactions on Circuits and Systems—I: Regular Papers, 2020, pp. 1-10.
Daniel Bankman, et al., An Always-On 3.8 μJ/86% CIFAR-10 Mixed-Signal Binary CNN Processor With All Memory on Chip in 28-nm CMOS, IEEE Journal of Solid-State Circuits, 2018, pp. 1-15.
Hossein Valavi, et al., A 64-Tile 2.4-Mb In-Memory-Computing CNN Accelerator Employing Charge-Domain Compute, IEEE Journal of Solid-State Circuits, 2019, pp. 1-11.
Shanshan Xie, et al., 16.2 eDRAM-CIM: Compute-In-Memory Design with Reconfigurable Embedded-Dynamic-Memory Array Realizing Adaptive Data Converters and Charge-Domain Computing, IEEE International Solid-State Circuits Conference, Digest of Technical Papers, 2021, pp. 248-249.
Zhengyu Chen, et al., 15.3 A 65nm 3T Dynamic Analog RAM-Based Computing in-Memory Macro and CNN Accelerator with Retention Enhancement, Adaptive Analog Sparsity and 44TOPS/W System Energy Efficiency, IEEE International Solid-State Circuits Conference, Digest of Technical Papers, 2021, pp. 240-241.
Jinshan Yue, et al., 14.3 A 65nm Computing-in-Memory-Based CNN Processor with 2.9-to-35.8TOPS/W System Energy Efficiency Using Dynamic-Sparsity Performance-Scaling Architecture and Energy-Efficient Inter/Intra-Macro Data Reuse, IEEE International Solid-State Circuits Conference, Digest of Technical Papers, 2020, pp. 234-235.
Qing Dong, et al., A 351TOPS/W and 372.4GOPS Compute-in-Memory SRAM Macro in 7nm FinFET CMOS for Machine-Learning Applications, IEEE International Solid-State Circuits Conference, Digest of Technical Papers, 2020, pp. 242-243.

* cited by examiner

| F/FB | W/WB | Multiplication result |
|---|---|---|
| 0/1 | 0/1 | 1 |
| 0/1 | 1/0 | 0 |
| 1/0 | 0/1 | 0 |
| 1/0 | 1/0 | 1 |

FIG. 4

|  | JSSC'19 [9] | ISSCC'20 [10] | ISSCC'20 [11] | ISSCC'21 [12] | ISSCC'21 [13] | This invention | |
|---|---|---|---|---|---|---|---|
| Storage type | SRAM | SRAM | SRAM | eDRAM | eDRAM | SRAM | |
| Process | 65nm | 65nm | 7nm | 65nm | 65nm | 55nm | |
| Bit unit structure | 10T1C | 8T | 8T | 1T1C | 3T1C | 10T1C | |
| Macro module size | 295KB | 4Kb | 4Kb | 16kb | 8kb | 4Kb | |
| Input accuracy | 1 | 2/4/6/8 | 4 | 8 | 4 | 1 | |
| Weight accuracy | 1 | 4/8 | 4 | 8 | 4 | 1 | |
| Output accuracy | 1 | 5 | 4 | 8 | 5 | 1 | |
| Supply voltage (V) | 0.68/0.94/1.2 | 0.9-1.05 | 0.65-1 | 1-1.2 | 0.85-1.1 | 0.3 | 0.6 |
| Frequency (MHz) | 100 | N/A | N/A | 50-200 | 100 | 12.7 | 129.4 |
| [1,2] Computing density | 1.5 | 5.83 | N/A | 0.008 | N/A | 0.74 | 7.52 |
| [1,2] Energy efficiency | 866 (macro) | 158.7 (macro) | 610.5 (macro) | 4.76 (system) | 216.8 (macro) | 18525 (macro) | 4963 (macro) |
|  |  | 35.8 (system) |  |  | 44.7 (system) | 6055 (system) | 1624 (system) |

[1] Assuming one multiplication and addition equals two operations
[2] Peak

FIG. 15

HIGH-ENERGY-EFFICIENCY BINARY NEURAL NETWORK ACCELERATOR APPLICABLE TO ARTIFICIAL INTELLIGENCE INTERNET OF THINGS

CROSS REFERENCE TO THE RELATED APPLICATIONS

This application is a continuation application of International Application No. PCT/CN2022/110406, filed on Aug. 5, 2022, which is based upon and claims priority to Chinese Patent Application No. 202111169933.X, filed on Oct. 8, 2021, the entire contents of which are incorporated herein by reference.

TECHNICAL FIELD

The present disclosure relates to a 0.3V high-energy-efficiency binary neural network accelerator.

BACKGROUND

Artificial intelligence Internet of Things (AIoT) is the integration of artificial intelligence (AI) and Internet of Things (IoT) in practical applications. With its powerful application scenario, the artificial intelligence Internet of Things has become the most possible and plastic development direction in the field of artificial intelligence, and is also the best way for intelligent upgrading of traditional industries. The artificial intelligence Internet of Things applies artificial intelligence capabilities to the Internet of Things infrastructure for ubiquitous data analysis. Therefore, high-energy-efficiency AI solutions are very popular due to the scarcity of resources and limited energy budgets of distributed Internet of Things platforms. For this reason, a quantized convolutional neural network (QCNN) is widely considered as a promising technology for AIoT applications [1, 2] and simplified model size, computation and energy. In particular, binarized convolutional neural networks (BCNN) have been proposed [3] in which pre-trained weights are actively quantized to 1 bit, whereby a lot of hardware and energy can be saved while providing satisfactory computational accuracy for AIoT reasoning tasks [4]. Although BCNN [5-7] has inherent algorithmic advantages, optimized hardware architectures such as near memory computation (NMC) and in-memory computation (IMC) with analog domain computations are also actively seeking to minimize data movement energy from an on-chip memory [8, 9]. Recent eDRAM designs have achieved higher macro-computation densities in terms of the type of memories used, but complex bit unit refresh modules thereof have limited the achievable peak energy efficiencies [10, 11]. Compared with the recent multi-bit SRAM work [12, 13], the current state-of-the-art (SOTA) [9] BNN accelerator for charge domain memory computation (CIM) achieves the best energy efficiency so far.

However, the existing binary neural network accelerators for charge domain in-memory computation still have the following challenges in improving energy efficiency:
  (1) Bit lines are connected with a large number of parallel capacitors, which consumes a
     large amount of convolution energy.
  (2) The energy efficiency of the binary neural network accelerator can be improved by
     working at sub/near threshold voltage, but serious accuracy losses will be caused.
  (3) The state-of-the-art structure of the bit lines inevitably requires a constant reset of the
     bit lines after each convolution, which prevents further reduction of the energy consumption
     of the bit lines.

References:
[1] Z. Liu, E. Ren, F. Qiao, Q. Wei, X. Liu, L. Luo, H. Zhao, and H. Yang, "NS-CIM: A Current-Mode Computation-in-Memory Architecture Enabling Near-Sensor Processing for Intelligent IoT Vision Nodes," IEEE Trans. Circuits Syst. I, vol. 67, no. 9, pp. 2909-2922, 2020.

[2] A. Di Mauro, F. Conti, P. D. Schiavone, D. Rossi, and L. Benini, "Always-On 674 μ W@ 4GOP/s Error Resilient Binary Neural Networks With Aggressive SRAM Voltage Scaling on a 22-nm IoT End-Node," IEEE Trans. Circuits Syst. I, vol. 67, no. 11, pp. 3905-3918, 2020.

[3] M. Courbariaux, I. Hubara, D. Soudry, R. El-Yaniv, and Y. Bengio, "Binarized neural networks: Training deep neural networks with weights and activations constrained to +1 or −1," arXiv preprint arXiv:1602.02830, 2016.

[4] B. Moons, K. Goetschalckx, N. Van Berckelaer, and M. Verhels, "Minimum energy quantized neural networks," in 2017 51st Asilomar Conf. on Signals, Systems, and Computers. IEEE, 2017, pp. 1921-1925.

[5] S. Zheng, P. Ouyang, D. Song, X. Li, L. Liu, S. Wei, and S. Yin, "An ultra-low power binarized convolutional neural network-based speech recognition processor with on-chip self-learning," IEEE Trans. Circuits Syst. I, vol. 66, no. 12, pp. 4648-4661, 2019.

[6] Y. Li, Z. Liu, W. Liu, Y. Jiang, Y. Wang, W. L. Goh, H. Yu, and F. Ren, "A 34-FPS 698-GOP/s/W binarized deep neural network-based natural scene text interpretation accelerator for mobile edge computing," IEEE Trans. Ind. Electron., vol. 66, no. 9, pp. 7407-7416, 2018.

[7] M. Koo, G. Srinivasan, Y. Shim, and K. Roy, "SBSNN: Stochastic-bits enabled binary spiking neural network with on-chip learning for energy efficient neuromorphic computing at the edge," IEEE Trans. Circuits Syst. I, vol. 67, no. 8, pp. 2546-2555, 2020.

[8] D. Bankman, L. Yang, B. Moons, M. Verhelst, and B. Murmann, "An Always-On 3.8 μJ/86% CIFAR-10 Mixed-Signal Binary CNN Processor With All Memory on Chip in 28-nm CMOS," IEEE J. Solid-State Circuits, vol. 54, no. 1, pp. 158-172, 2018.

[9] H. Valavi, P. J. Ramadge, E. Nestler, and N. Verma, "A 64-tile 2.4-mb in-memory-computing cnn accelerator employing charge-domain compute," IEEE J. Solid-State Circuits, vol. 54, no. 6, pp. 1789-1799, 2019.

[10] S. Xie et al., "16.2 eDRAM-CIM: Compute-In-Memory Design with Reconfigurable EmbeddedDynamic-Memory Array Realizing Adaptive Data Converters and Charge-Domain Computing," ISSCC, pp. 248-250, 2021.

[11] Z. Chen et al., "15.3 A 65 nm 3T Dynamic Analog RAM-Based Computing-in-Memory Macro and CNN Accelerator with Retention Enhancement, Adaptive Analog Sparsity and 44TOPS/W System Energy Efficiency," ISSCC, pp. 240-242, 2021.

[12] J. Yue et al., "14.3 A 65 nm Computing-in-Memory-Based CNN Processor with 2.9-to-35.8TOPS/W System Energy Efficiency Using Dynamic-Sparsity Performance-Scaling Architecture and EnergyEfficient Inter/Intra-Macro Data Reuse," ISSCC, pp. 234-236, 2020.

[13] Q. Dong et al., "A 351TOPS/W and 372.4GOPS Compute-in-Memory SRAM Macro in 7 nm FinFET CMOS for Machine-Learning Applications", ISSCC, pp. 242-243, 2020.

SUMMARY

An object of the present disclosure is to solve the problem of improving energy efficiency of the existing binary neural network accelerators for charge domain in-memory computation.

In order to achieve the above-mentioned object, the technical solution of the present disclosure is to provide a high-energy-efficiency binary neural network accelerator applicable to artificial intelligence Internet of Things, including:

a multiplication bit unit array, composed of L×L sub/near threshold 10T1C multiplication bit units based on series capacitors, the sub/near threshold 10T1C multiplication bit unit being configured to perform binary multiplication and accumulation operations in one clock cycle and being composed of a 6T storage bit unit and a 4T1C memory XNOR logical unit, wherein the 6T storage bit unit is configured to store weight values W and WB, W is a weight value of a neural network obtained by pre-training, and WB is a bar signal of W; the 4T1C memory XNOR logical unit realizes XNOR logic between input activation values F and FB and the weights W and WB stored in the 6T storage bit unit; capacitors in the 4T1C memory XNOR logical unit are connected in series to an accumulated bit line ABL; a multiplication result directly generates a final convolution result on the accumulated bit line ABL through charge distribution of the capacitors of the 4T1C memory XNOR logical unit, F is a binary value of the input activation value, and FB is a bar signal of F; and a voltage amplification array with a size of 20×L, wherein each column is designed with 20 low-voltage amplification units with different transistor sizes, and only one low-voltage amplification unit is selected from each column of 20 low-voltage amplification units for correct amplification according to a pre-trained binary batch standardized bias coefficient α; the selected low-voltage amplification unit is configured with a corresponding body bias voltage, and an output voltage approaches ½VDD to ensure that a maximum voltage gain is obtained for each low-voltage amplification unit.

Preferably, the sub/near threshold 10T1C multiplication bit unit adopts a multi-VT design strategy to overcome PMOS/NMOS skew at low voltage.

Preferably, a PMOS transistor used in the 6T storage bit unit is LVT and an NMOS transistor is HVT.

Preferably, all transistors of the sub/near threshold 10T1C multiplication bit unit adopt a gate length bias technology to reduce the influence of device mismatch and adopt an adaptive body bias technology to reduce device deviation.

Preferably, the capacitors of the 4T1C memory XNOR logical unit are realized by MOM capacitors of high-level interdigitated metal.

Preferably, the voltage amplification array realizes amplification based on the following steps:
1) selecting a low-voltage amplification unit with the maximum gain from each column of 20 low-voltage amplification units according to the bias coefficient α;
2) converting the bias coefficient α into an analog voltage value V1 through a DAC unit to an input end of the low-voltage amplification unit selected in the previous step, an output voltage V1' of the low-voltage amplification unit being sampled and held by using a first sampling capacitor;
3) sending an analog voltage value V2 on the accumulated bit line ABL to the input end of the same low-voltage amplification unit in step 2), an output voltage V2' of the low-voltage amplification unit being sampled and held by using a second sampling capacitor; and
4) obtaining a correct comparison result, i.e. a batch standardized result, by comparing voltages output by two first sampling capacitors and second sampling capacitor through a low-voltage comparator since V2'-V1'>>V2-V1.

Preferably, determining an optimal body bias voltage of all the selected low-voltage amplification units by a body bias voltage computing circuit includes the following steps:
a) respectively inputting an equal interval scanning voltage of $\frac{1}{21}$VDD to $\frac{20}{21}$VDD into 20 low-voltage amplification units, which are pre-adjusted in size, one by one for each column of low-voltage amplification units;
b) continuously comparing output results of the 20 low-voltage amplification units with input values of $\frac{1}{21}$VDD to $\frac{20}{21}$VDD with a reference voltage of ½VDD through an operational amplifier OPA, performing body bias on all NMOS transistors of the current low-voltage amplification unit in a closed-loop manner by the output of the operational amplifier OPA, further digitizing an output body bias voltage by a 6-bit SAR ADC unit to obtain a body bias digital code of the current low-voltage amplification unit, and storing the body bias digital code in a 6-bit register corresponding to each low-voltage amplification unit; and
c) after selecting a low-voltage amplification unit with the maximum gain from each column of 20 low-voltage amplification units according to the bias coefficient α, taking out the body bias digital code corresponding to the selected low-voltage amplification unit from the register, restoring the body bias digital code to an analog value through the DAC unit, and inputting the analog value to a body bias node of the NMOS transistor of the corresponding low-voltage amplification unit, thus starting to perform voltage amplification on the bias coefficient α and the accumulated bit line ABL.

Preferably, the DAC unit is a 5-bit auxiliary DAC unit and a 6-bit high-accuracy DAC unit based on a capacitor array, the 5-bit auxiliary DAC unit pre-charges parasitic capacitors of an input node and a body bias node of the low voltage amplification unit to generate a roughly estimated analog voltage, and the 6-bit high-accuracy DAC unit generates an accurate analog voltage on this basis.

Preferably, the accumulated bit line ABL adopts a lazy accumulated bit line reset scheme which sets a reset interval N according to different supply voltages and the size of a convolution kernel adopted by a neural network, and a reset operation of the accumulated bit line ABL is effective after the $N^{th}$ convolution and batch standardized operation.

Compared with the prior art, the binary neural network accelerator proposed in the present disclosure has the following characteristics:
(1) 0.3-0.6V sub/near threshold 10T1C multiplication bit units with series capacitors are configured for charge domain binary convolution.
(2) An anti-process deviation differential voltage amplification array between bit lines and DACs provided in the present disclosure is configured for robust pre-amplification in 0.3V batch standardized operations.
(3) A lazy bit line reset scheme provided in the present disclosure further reduces energy, and inference accuracy losses can be ignored.

Therefore, a binary neural network accelerator chip based on in-memory computation provided in the present disclosure achieves peak energy efficiency of 18.5 POPS/W and 6.06 POPS/W, which are respectively improved by 21× and 135× compared with previous macro and system work [9, 11].

BRIEF DESCRIPTION OF THE DRAWINGS

FIG. 1A illustrates that the present disclosure solves the problem of excessive energy required for bit line convolution in the prior art. FIG. 1B illustrates that the present disclosure solves the problem of near/sub threshold accuracy losses in the prior art. FIG. 1C illustrates that the present disclosure solves the problem of accumulated bit line reset after each convolution in the prior art. FIG. 1D illustrates a peak energy efficiency comparison of the present disclosure with the prior art.

FIG. 4 is a multiplication operation table for a 10T1C multiplication bit unit.

FIG. 15 is a table comparing the present disclosure with the prior art.

DETAILED DESCRIPTION OF THE EMBODIMENTS

The following further describes the present disclosure with reference to specific embodiments. It should be understood that these embodiments are only for illustrating the present disclosure and are not intended to limit the scope of the present disclosure. In addition, it should be understood that, after reading the above teaching of the present disclosure, those skilled in the art can make various changes or modifications to the present disclosure, and these equivalent forms also fall within the scope defined by the appended claims of this disclosure.

Figure 1A:
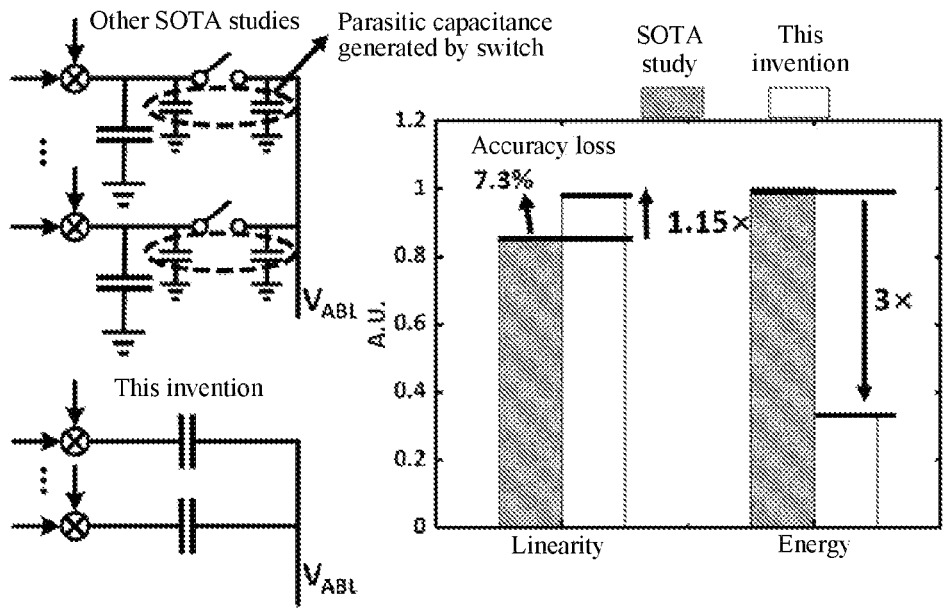
FIGS. 1A, 1B, 1C, and 1D illustrate a comparison of the present disclosure with the prior art.
Figure 1B:
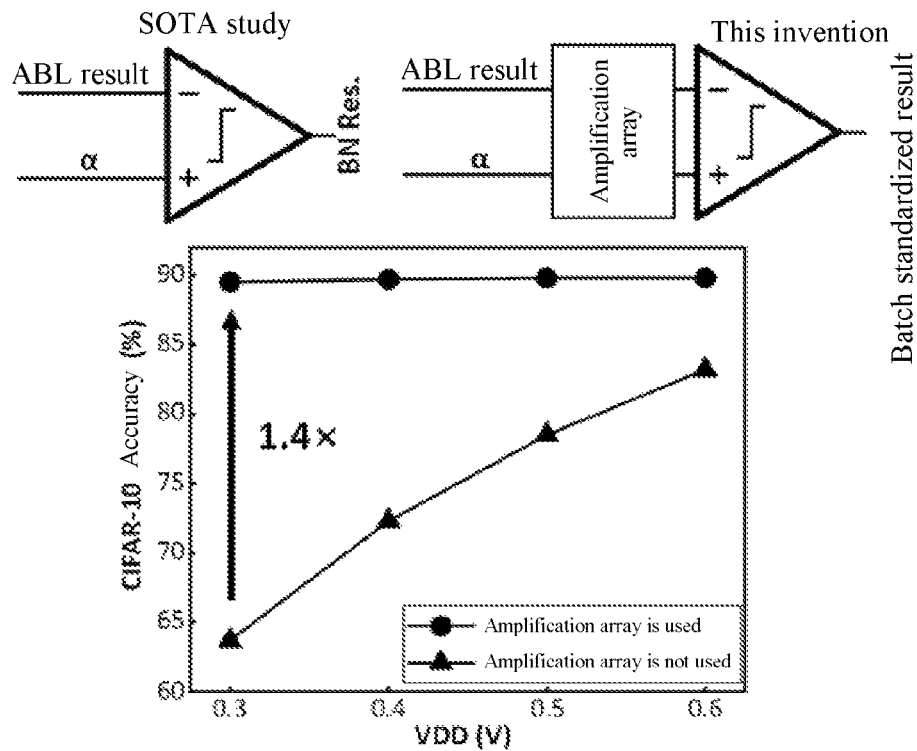
Figure 1C:
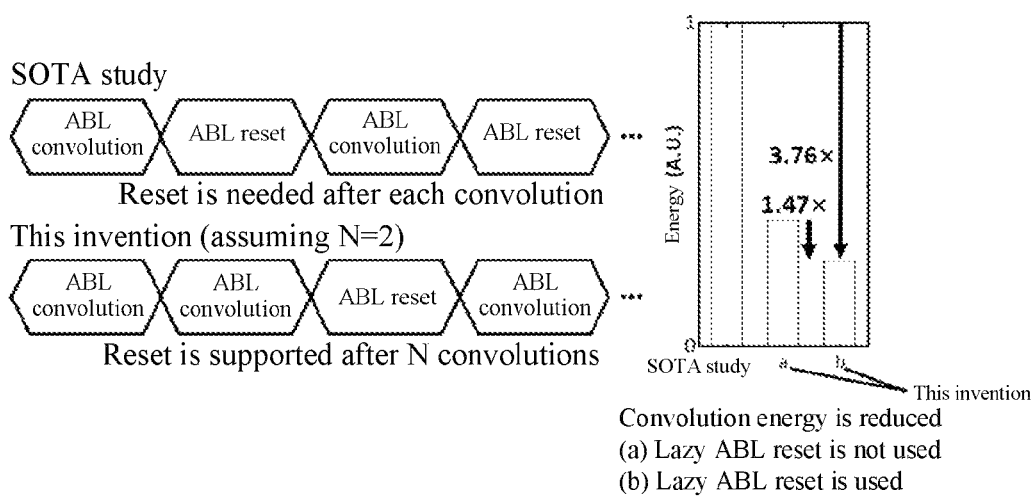
Figure 1D:
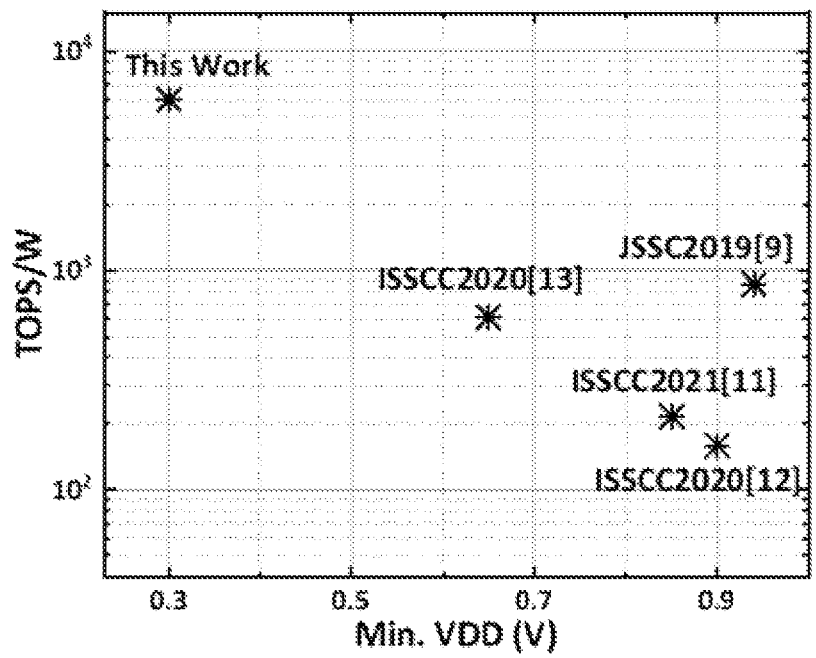
Figure 2:
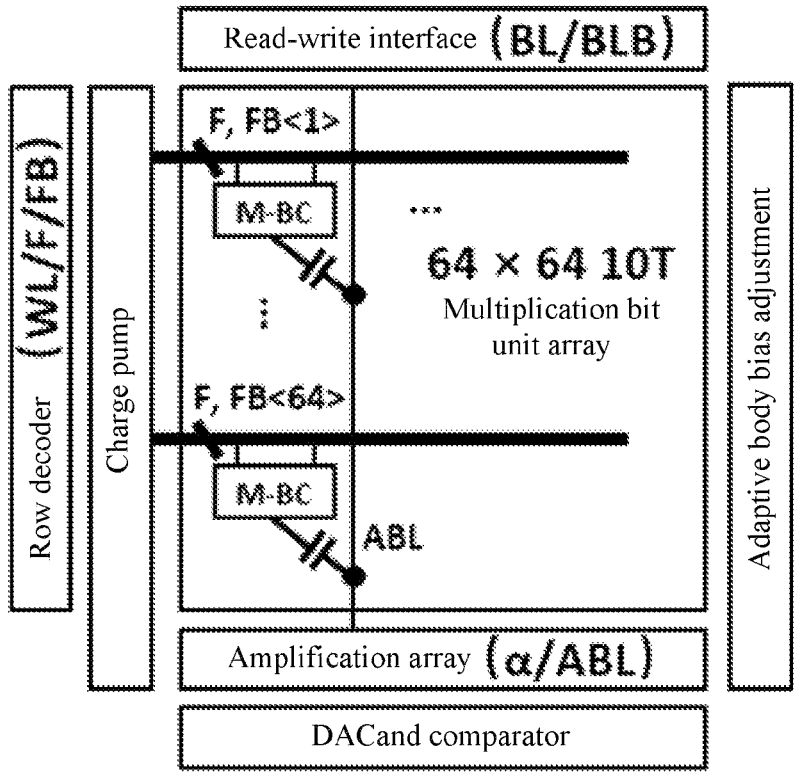
FIG. 2 is a system architecture diagram of the present disclosure.

As shown in FIG. 2, the present disclosure provides a 0.3V high-energy-efficiency binary neural network accelerator applied to artificial intelligence Internet of Things, including a multiplication bit unit array composed of 64×64 0.3-0.6V sub/near threshold 10T1C multiplication bit units based on series capacitors.

Figure 3:
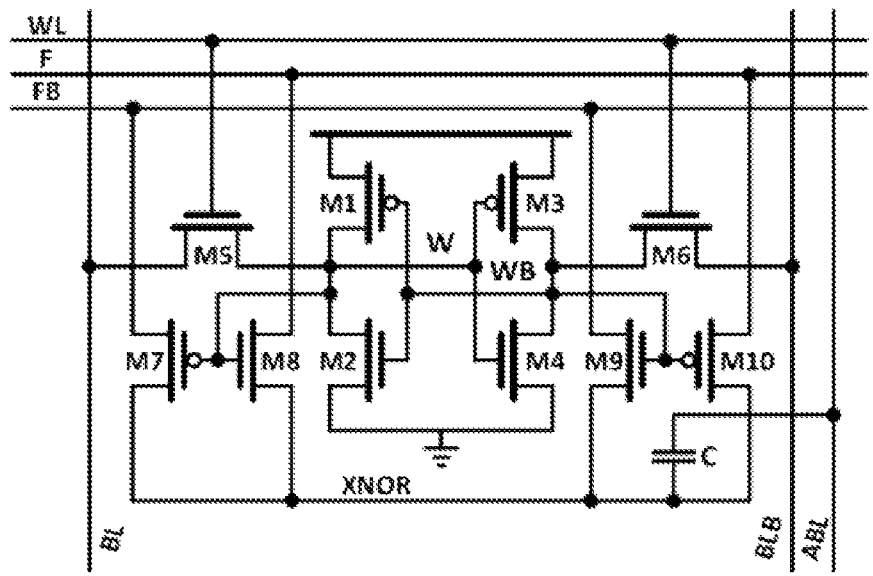
FIG. 3 is a schematic diagram of a 0.3-0.6V sub/near threshold 10T1C multiplication bit unit.

FIG. 3 shows the design of a 10T1C multiplication bit unit for energy-optimized and reliable charge domain binary convolution operations when a power voltage is reduced to 0.3-0.6V. The multiplication bit unit in the present disclosure for performing binary multiplication and accumulation operations in one clock cycle is composed of a 6T storage bit unit M1-M6 and a 4T1C memory XNOR logical unit M7-M10, C. The 6T storage bit unit is configured to store weight values W and WB. The 4T1C memory XNOR logical unit realizes XNOR logic between input activation values F and FB and the weights W and WB stored in the 6T storage bit unit. MOM capacitors in the 4T1C memory XNOR logical unit are connected in series to an accumulated bit line ABL. In the foregoing, F is a binary value of the input activation value, FB is a bar signal of F, W is a weight value of a neural network obtained by pre-training, and WB is a bar signal of W.

When the weight values W and WB are written into the 6T storage bit unit, write channels of a bit line BL and a bit line BLB are turned on row by row through a signal on a word line WL (BLB is a bar signal of BL), and the pre-trained weight values W and WB are respectively written into the 6T storage bit unit of the 10T1C multiplication bit unit through the bit line BL and the bit line BLB. After the activation values F and FB are input from the outside of a chip, the weight values W and WB stored in the 6T storage bit unit perform a 1-bit multiplication operation with the activation values F and FB through the 4T1C memory XNOR logical unit, and a multiplication result directly generates a final convolution result on the accumulated bit line ABL through charge distribution of the MOM capacitors of the 4T1C memory XNOR logical unit.

Multiplication in a binary neural network uses two values +1 and −1, mapped to logic "1" and "0" in hardware.

In conjunction with FIG. 4, 10T1C multiplication operation cases are as follows:

(1) The input activation values are F=1, FB=0 (i.e. the input is +1), the stored weight values are W=1, WB=0 (i.e. the weight is +1), and the result is F⊕W=1 (i.e. the result is +1).

(2) The input activation values are F=1, FB=0 (i.e. the input is +1), the stored weight values are W=0, WB=1 (i.e. the weight is −1), and the result is F⊕W=0 (i.e. the result is −1).

(3) The input activation values are F=0, FB=1 (i.e. the input is −1), the stored weight values are W=1, WB=0 (i.e. the weight is +1), and the result is F⊕W=0 (i.e. the result is −1).

(4) The input activation values are F=0, FB=1 (i.e. the input is −1), the stored weight values are W=0, WB=1 (i.e. the weight is −1), and the result is F⊕W=1 (i.e. the result is +1).

Accumulated bit line ABL operation cases are as follows:

(1) If 64 capacitors are connected to the accumulated bit line ABL where the number of capacitors F⊕W=1 is 64 and the number of capacitors F⊕W=0 is 0, then the accumulated bit line obtains a convolution result of VDD.

(2) If 64 capacitors are connected to the accumulated bit line where the number of capacitors F⊕W=1 is 0 and the number of capacitors F⊕W=0 is 64, then the accumulated bit line obtains a convolution result of GND.

(3) If 64 capacitors are connected to the accumulated bit line where the number of capacitors F⊕W=1 is 32 and the number of capacitors F⊕W=0 is 32, then the accumulated bit line obtains a convolution result of ½VDD.

(4) If 64 capacitors are connected to the accumulated bit line where the number of capacitors F⊕W=1 is Np and the number of capacitors F⊕W=0 is 64-Np, then the accumulated bit line obtains a convolution result of (Np/64)*VDD.

Figure 5:
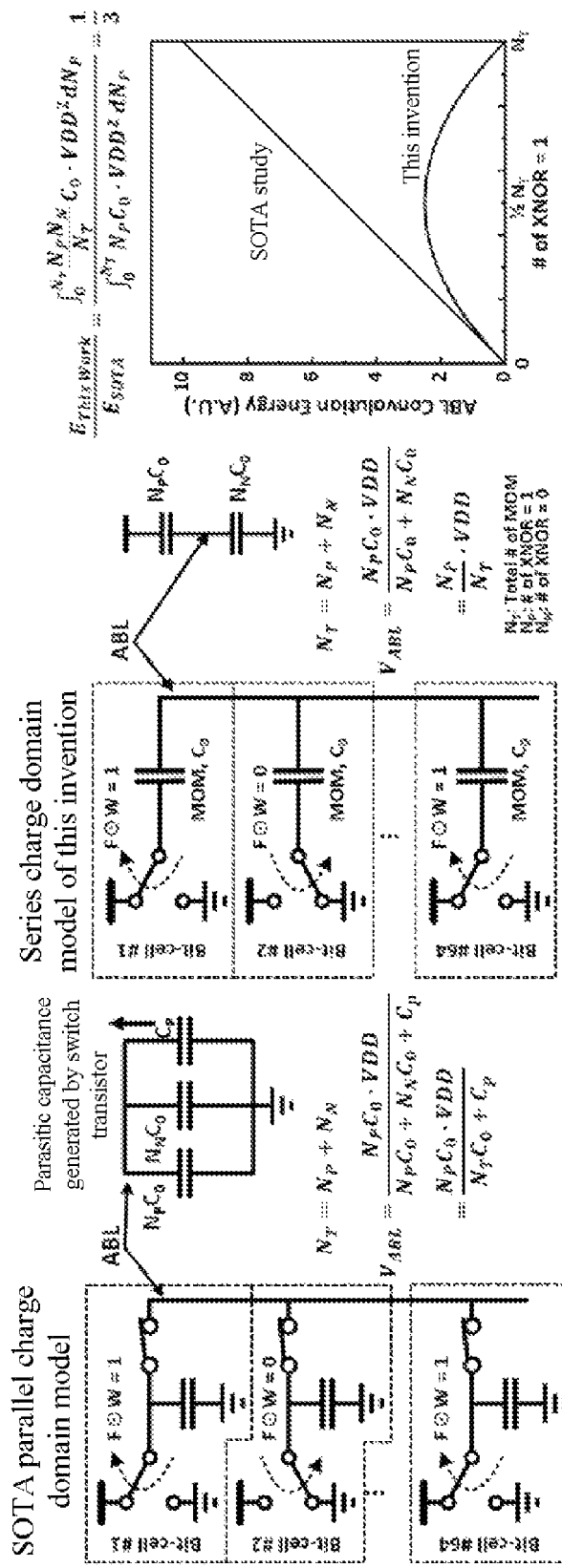
FIG. 5 is a diagram comparing a series capacitor scheme of the present disclosure with the existing parallel capacitor scheme.

Compared with the previous bit unit [9] based on parallel capacitors, the 0.3-0.6V sub/near threshold 10T1C multiplication bit units with series capacitors proposed in the present disclosure save a lot of energy. An equivalent charge domain circuit model is shown in FIG. 5. In the design of the bit units based on parallel capacitors, the final accumulation is achieved by charge redistribution between all the parallel capacitors and parasitic diffusion capacitors. The energy consumption thereof is proportional to the number of charged capacitors along the accumulated bit line. In contrast, in the design of the 0.3-0.6V sub/near threshold 10T1C multiplication bit units with series capacitors proposed in the present disclosure, different charge domain processes are adopted, an accumulated voltage on the accumulated bit lines is composed of the number of charged capacitors (i.e. the number of F⊕W=1) and the number of non-charged capacitors (i.e. the number of F⊕W=0). Assuming a uniform distribution of the number of charged capacitors (i.e. the number of XNOR=1), the present disclosure theoretically reduces convolution energy by 66.7% compared with the existing design based on parallel capacitors.

In addition, the 0.3-0.6V sub/near threshold 10T1C multiplication bit units with series capacitors provided in the present disclosure are also optimized in the following aspects so as to ensure low voltage reliability in case of process deviation, and reduce standby power.

The 10T1C multiplication bit unit proposed in the present disclosure adopts a multi-VT design strategy to overcome PMOS/NMOS skew at low voltage. A PMOS transistor used in the 6T storage bit unit is LVT, and an NMOS transistor is HVT. In addition, a gate length bias technology is adopted in all the transistors (LN=80 nm, LP=150 nm) to reduce the influence of device mismatch, and an adaptive body bias technology is adopted to reduce device deviation. In order to save area, the capacitors of the 4T1C memory XNOR logical unit are realized by MOM capacitors of high-level interdigitated metal. The area of the 10T1C multiplication bit unit proposed in the present disclosure is only 1.98 times that of the 6T bit unit.

Figure 6:
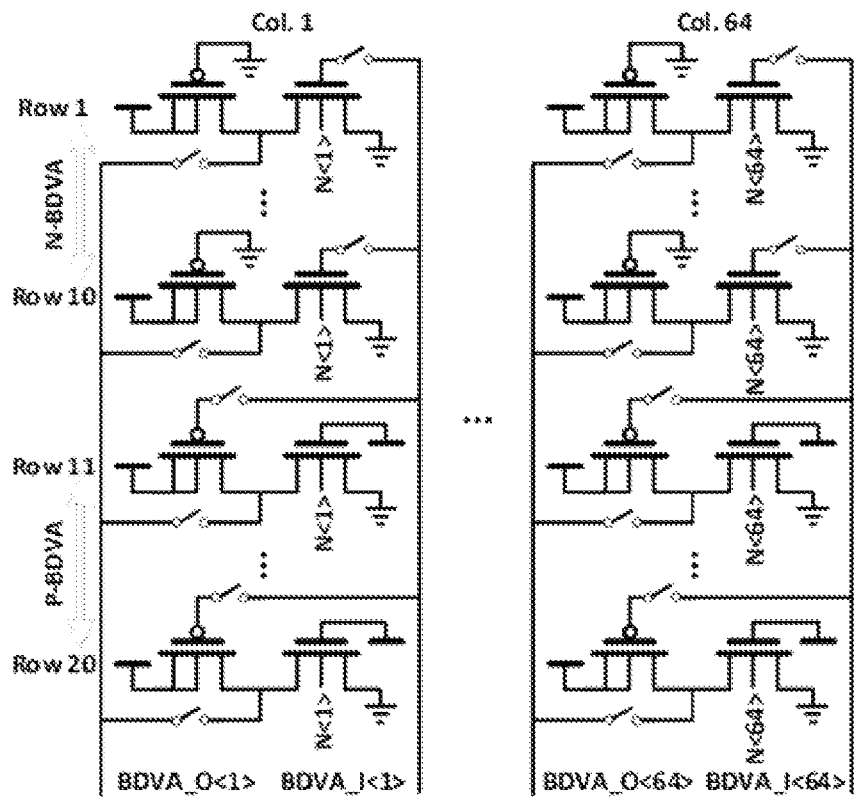
FIG. 6 is a schematic diagram of a voltage amplification array.

As shown in FIG. 6, the present disclosure provides a high-energy-efficiency binary neural network accelerator, further including a voltage amplification array with a size of 20×64. Each column is designed with 20 low-voltage amplification units with different transistor sizes. However, only one low-voltage amplification unit (i.e. a total of 64 low-voltage amplification units) is selected from each column of 20 low-voltage amplification units for correct amplification according to a pre-trained binary batch standardized bias coefficient α. The selected low-voltage amplification unit is configured with a corresponding body bias voltage, and an output voltage approaches ½VDD to ensure that a maximum voltage gain is obtained for each low-voltage amplification unit.

Figure 7:
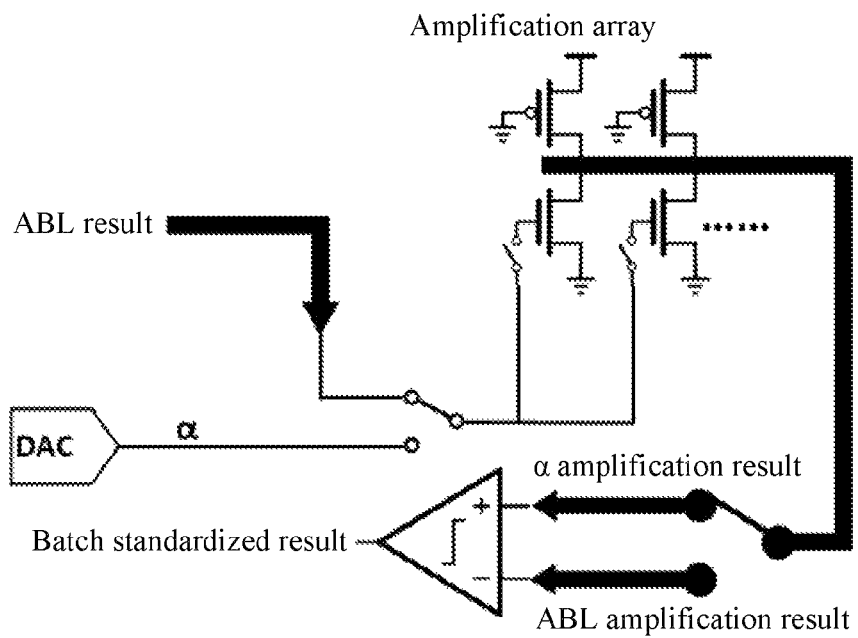
FIG. 7 is a schematic working flow diagram of a voltage amplification array.
Figure 8:
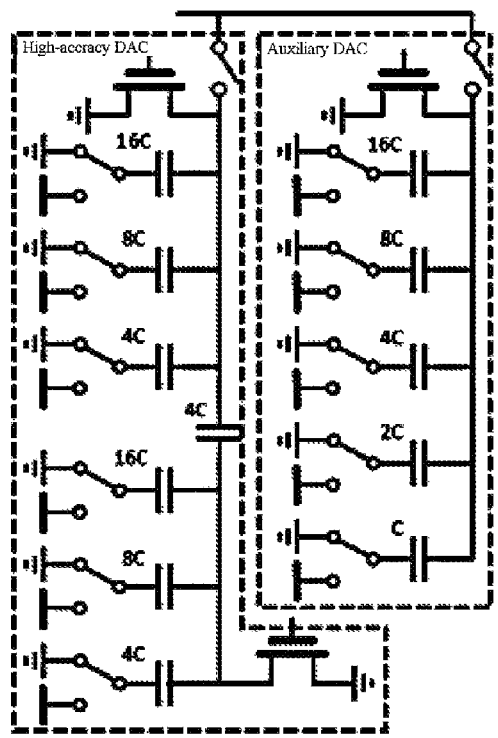
FIG. 8 is a schematic diagram of a DAC unit.

As shown in FIG. 7, the bias coefficient α and the voltage of the accumulated bit line ABL are sampled and held by a switch capacitor circuit before a main comparator stage, whereby differential input offset and device mismatch of an amplifier can be avoided. In order to accurately drive the input and body bias of the low-voltage amplification unit, as shown in FIG. 8, the DAC unit in the present disclosure is a 5-bit auxiliary DAC unit and a 6-bit high-accuracy DAC unit based on a capacitor array, the 5-bit auxiliary DAC unit pre-charges parasitic capacitors of an input node and a body bias node of the low voltage amplification unit to generate a roughly estimated analog voltage, and the 6-bit high-accuracy DAC unit generates an accurate analog voltage on this basis.

The voltage amplification array realizes amplification based on the following steps:
1) selecting a low-voltage amplification unit with the maximum gain from each column of 20 low-voltage amplification units according to the bias coefficient α;
2) converting the bias coefficient α into an analog voltage value V1 through the foregoing DAC unit to an input end of the low-voltage amplification unit selected in the previous step, an output voltage V1' of the low-voltage amplification unit being sampled and held by using a first sampling capacitor;
3) sending an analog voltage value V2 on the accumulated bit line ABL to the input end of the same low-voltage amplification unit in step 2), an output voltage V2' of the low-voltage amplification unit being sampled and held by using a second sampling capacitor; and
4) obtaining a correct comparison result, i.e. a batch standardized result, by comparing voltages output by two first sampling capacitors and second sampling capacitor through a low-voltage comparator since V2'-V1'>>V2-V1.

Before voltage amplification is achieved, an on-chip post-silicon tuning program is required to adjust the body bias of all the low-voltage amplification units to achieve optimal distribution characteristics. In the present disclosure, determining an optimal body bias voltage of all the selected low-voltage amplification units by a body bias voltage computing circuit includes the following steps:
a) respectively inputting an equal interval scanning voltage of 1/21VDD to 20/21VDD into 20 low-voltage amplification units, which are pre-adjusted in size, one by one for each column of low-voltage amplification units;
b) continuously comparing output results of the 20 low-voltage amplification units with input values of 1/21VDD to 20/21VDD with a reference voltage of 1/2VDD through an operational amplifier OPA, performing body bias on all NMOS transistors of the current low-voltage amplification unit in a closed-loop manner by the output of the operational amplifier OPA, further digitizing an output body bias voltage by a 6-bit SAR ADC unit to obtain a body bias digital code of the current low-voltage amplification unit, and storing the body bias digital code in a 6-bit register corresponding to each low-voltage amplification unit; and
c) after selecting a low-voltage amplification unit with the maximum gain from each column of 20 low-voltage amplification units according to the bias coefficient α, taking out the body bias digital code corresponding to the selected low-voltage amplification unit from the register, restoring the body bias digital code to an analog value through the foregoing DAC unit, and inputting the analog value to a body bias node of the NMOS transistor of the corresponding low-voltage amplification unit, thus starting to perform voltage amplification on the bias coefficient α and the accumulated bit line ABL.

Figure 9:
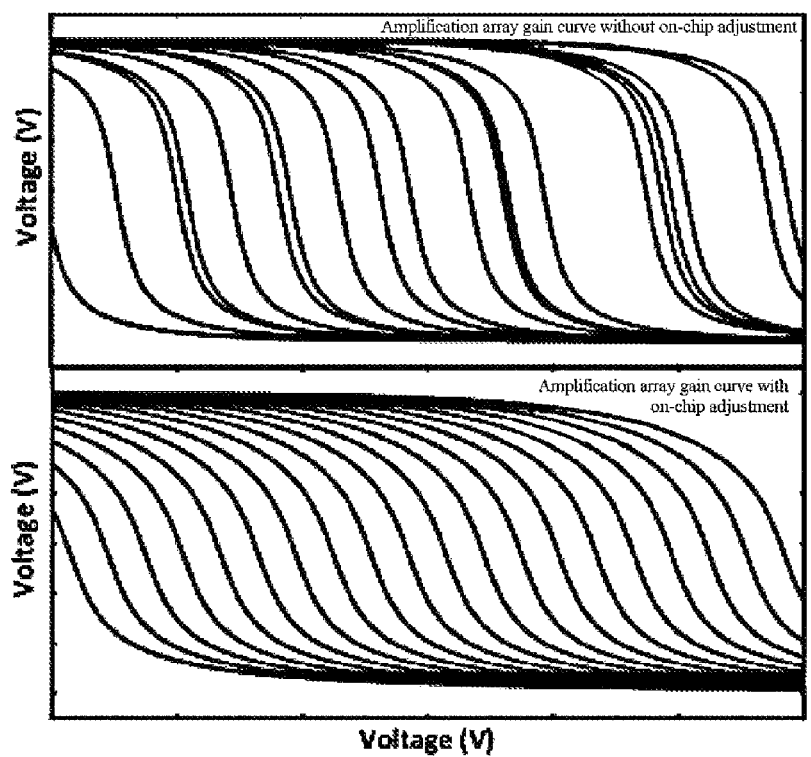
FIG. 9 is a schematic diagram of an effect of adjusting a high gain amplification array according to the present disclosure.

After the tuning process, as shown in FIG. 9, the gain of the low-voltage amplification unit in the present disclosure is about 9-17 times, the voltage difference between the bias coefficient α and the accumulated bit line ABL may be distinguished, and the voltage difference may be distinguished as low as 2.1 mV.

Figure 10:
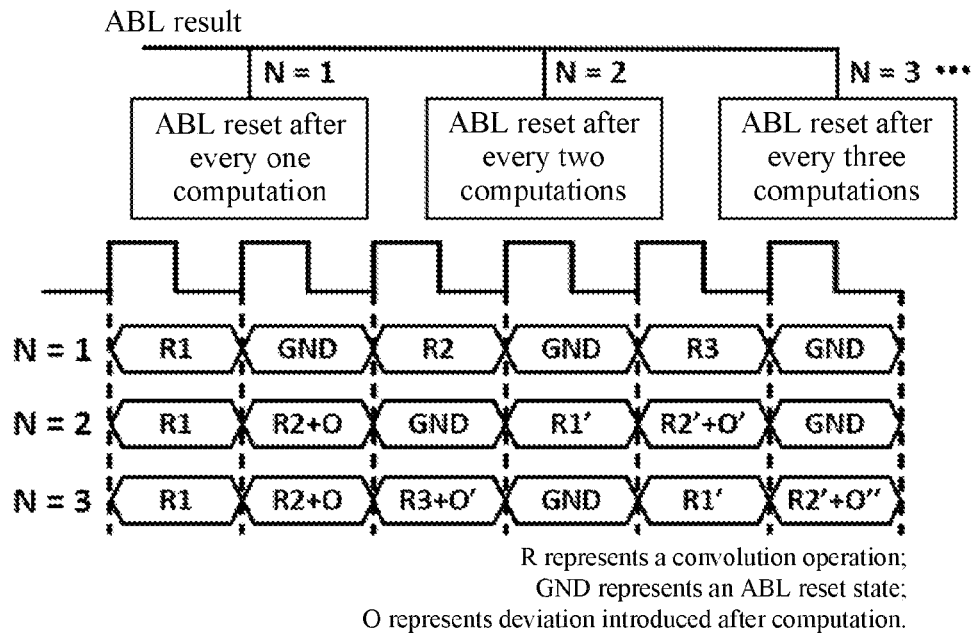
FIG. 10 is a schematic diagram of a lazy ABL reset (LAR) operation mechanism according to the present disclosure.
Figure 11:
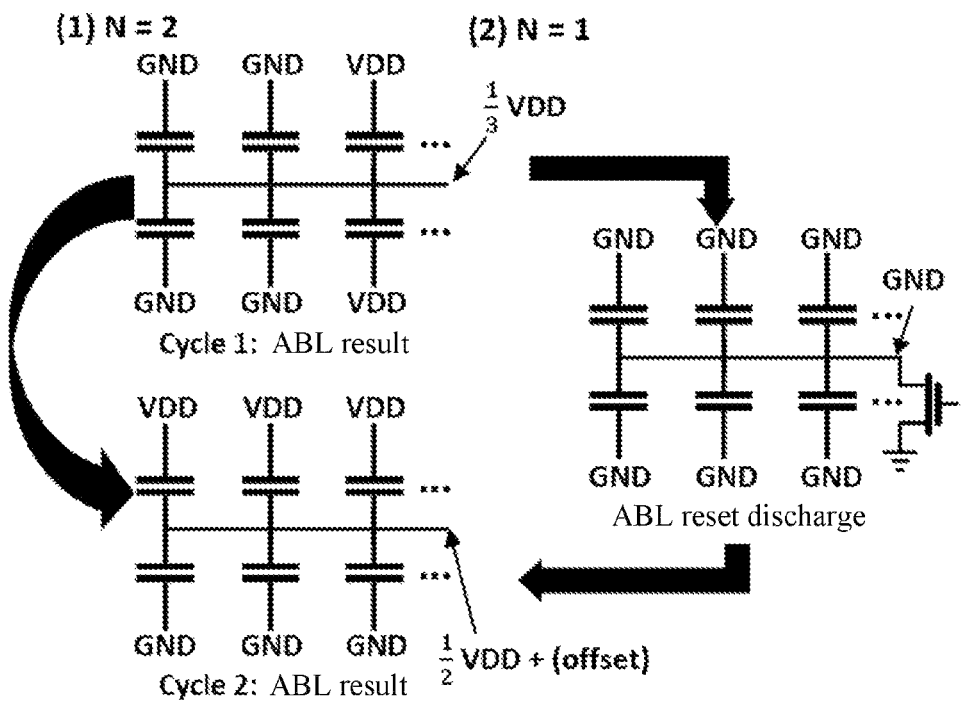
FIG. 11 is a comparison of reset intervals N=1 and N=2 for LAR.
Figure 12:
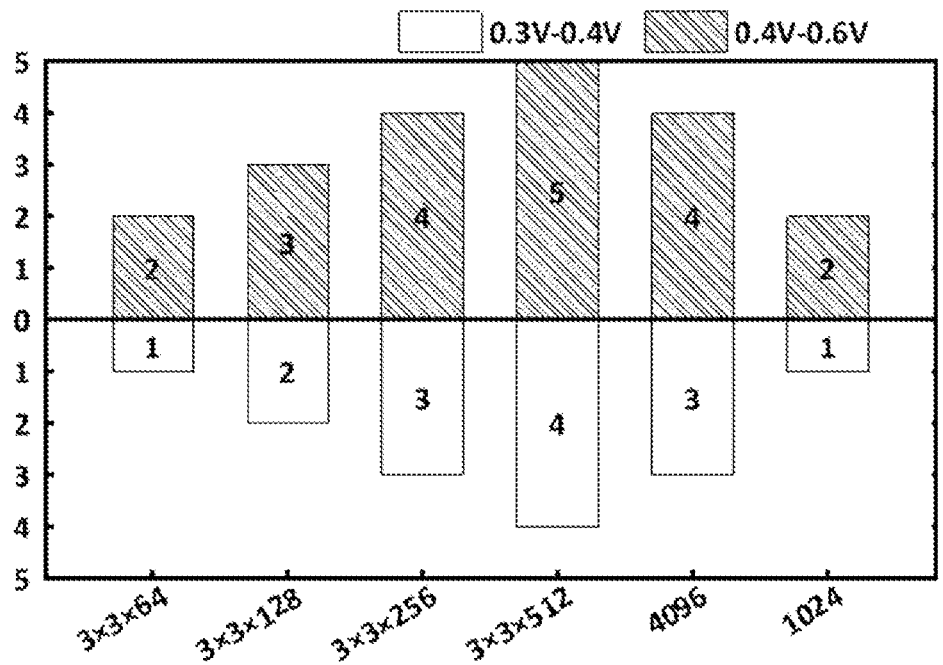
FIG. 12 shows reset interval values of LAR corresponding to different convolution kernels under the power supply of 0.3V-0.6V.
Figure 13:
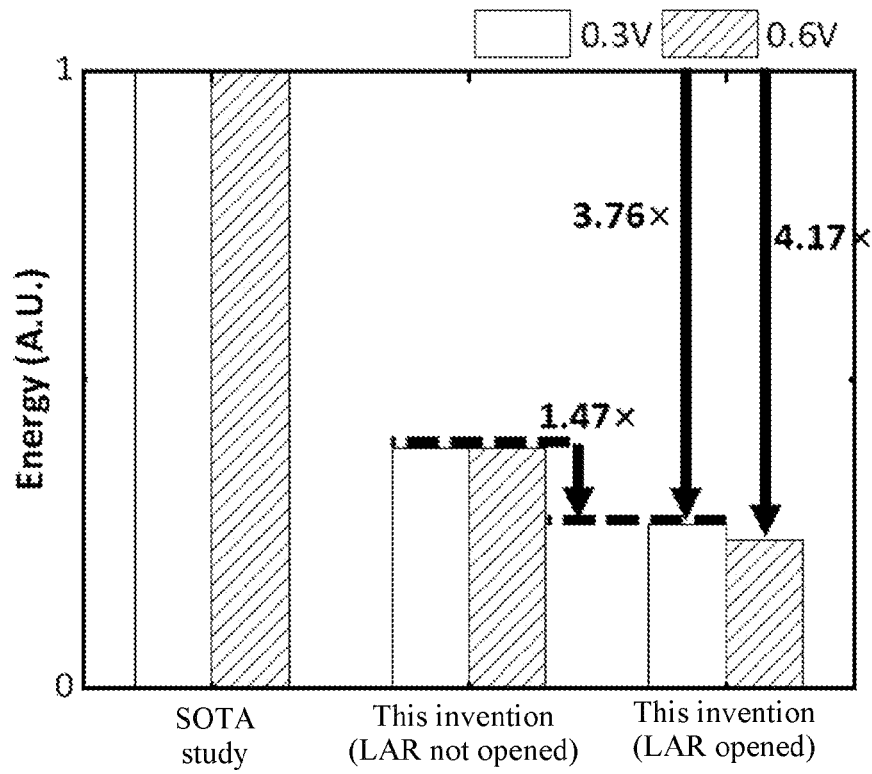
FIG. 13 is a diagram comparing results of energy overhead after taking LAR.

FIG. 10 also illustrates a lazy accumulated bit line reset scheme adopted by the present disclosure that allows the next binary accumulation cycle to be performed without reset the remaining charge on the accumulated bit line ABL. The lazy accumulated bit line reset scheme proposed in the present disclosure saves a lot of energy at the expense of minimal computational error and inference accuracy loss. Since the charge distribution between the accumulated bit line ABL and the parasitic capacitor of the input node of the low-voltage amplification unit is the main cause of the error when performing the binary batch standardized operation, it is necessary to control the reset frequency appropriately. As shown in FIG. 12, the present disclosure sets a group of reset intervals N, N=1-4, N=3, N=1, thereby causing an inference accuracy loss of 0.3%-0.4% on a CIFAR-10 data set for VGG-16 with convolution kernel sizes 3×3×64-512 (CONV), 4096×1 (FC), and 1000×1 (FC) when the power supply range is 0.3V to 0.4V. When the supply voltage ranges from 0.4V to 0.6V, the present disclosure configures another group of reset intervals N for different sizes of convolution kernels, N=2-5, N=4, N=2, and the corresponding inference accuracy loss is 0.2%-0.3%. The lazy accumulated bit line reset scheme provided in the present disclosure further reduces the bit line energy by 32% and 38.7% for the two reset intervals N.

The lazy accumulated bit line reset operation is illustrated as follows:

(1) N=1: accumulated bit line convolution→bias coefficient α amplification→accumulated bit line amplification→accumulated bit line reset→accumulated bit line convolution→bias coefficient α amplification→accumulated bit line amplification→accumulated bit line reset. . .

(2) N=2: accumulated bit line convolution→bias coefficient α amplification→accumulated bit line amplification→accumulated bit line convolution→bias coefficient α amplification→accumulated bit line amplification→accumulated bit line reset. . .

(3) N=3: accumulated bit line convolution→bias coefficient α amplification→accumulated bit line amplification→accumulated bit line convolution→bias coefficient α amplification→accumulated bit line amplification→accumulated bit line convolution→bias coefficient α amplification→accumulated bit line amplification→accumulated bit line reset. . .

The above-mentioned 0.3V high-energy-efficiency binary neural network accelerator needs to realize complete convolution and batch standardized operations by means of the following operation steps:

At step 1, write channels of a bit line BL and a bit line BLB are turned on row by row through a signal on a word line WL, and the pre-trained weight values W and WB are respectively written into the 6T storage bit unit of each 10T1C multiplication bit unit through the bit line BL and the bit line BLB.

The operation of step 2 begins until all rows of the multiplication bit array are written with the weight values.

At step 2, a body bias voltage of each low-voltage amplification unit of the voltage amplification array is obtained.

In the first stage, an equal interval scanning voltage of $\frac{1}{21}$VDD to $\frac{20}{21}$VDD is respectively input into 20 low-voltage amplification units, which are pre-adjusted in size, one by one.

In the second stage, output results of the low-voltage amplification units with input values of $\frac{1}{21}$VDD to $\frac{20}{21}$VDD are continuously compared with a reference voltage of $\frac{1}{2}$VDD through an operational amplifier OPA, and the output of the operational amplifier OPA performs body bias on all NMOS transistors of the current low-voltage amplification unit in a closed-loop manner. The body bias voltage is further digitized by a 6-bit SAR ADC unit to form a body bias digital code, and the body bias digital code is stored in a 6-bit register corresponding to each low-voltage amplification unit.

In the third stage, an optimal low-voltage amplification unit is selected according to the bias coefficient α, the corresponding body bias digital code stored in the 6-bit register is restored to an analog value, and the analog value is input to an NMOS body bias node of the selected low-voltage amplification unit, thus starting to perform voltage amplification on the bias coefficient α and the accumulated bit line ABL.

At step 3, the activation values F and FB are input from the outside of a chip, W and WB perform a 1-bit multiplication operation with F and FB through 4T1C, and a multiplication result directly generates a final convolution result on the accumulated bit line through charge distribution of the MOM capacitors. So far, a single complete convolution operation has been completed.

At step 4, a batch standardized coefficient, i.e. a bias coefficient α, is input from the outside of the binary neural network accelerator, and the low-voltage amplification unit with the maximum gain is selected according to the bias coefficient α.

The bias coefficient α is converted into an analog voltage value V1 to an input end of the selected low-voltage amplification unit, and an output voltage V1' of the low-voltage amplification unit is sampled and held by using a first sampling capacitor. An analog voltage value V2 of the accumulated bit line is sent to the input end of the same low-voltage amplification unit, and an output voltage V2' of the low-voltage amplification unit is sampled and held by using a second sampling capacitor. A correct comparison result may be obtained by comparing voltages output by the first sampling capacitor and the second sampling capacitor through a low-voltage comparator since V2'-V1'>>V2-V1. So far, a batch standardized operation has been completed.

At step 5, the optional accumulated bit line ABL is reset, and the process returns to step 3 for the next convolution. If the reset interval N is equal to 1, the reset operation is effective after each convolution and batch standardized operation. If the reset interval N is equal to 2, the reset operation is effective once after every two convolutions and batch standardized operations. N is another value, and so on.

Figure 14A:
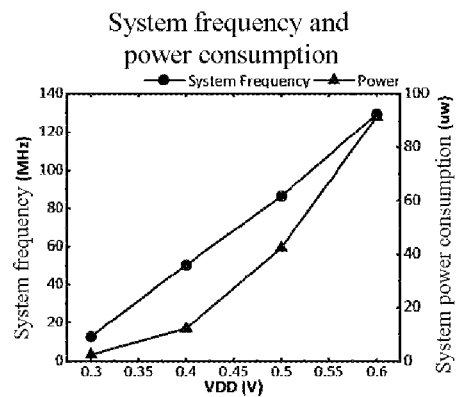
FIGS. 14A-14E show a schematic diagram of a measurement result.
Figure 14B:
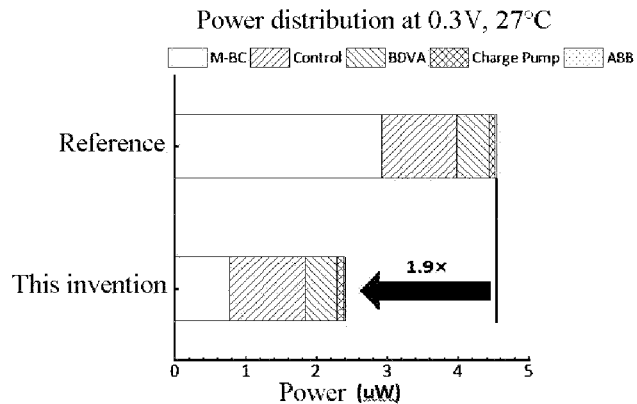
Figure 14C:
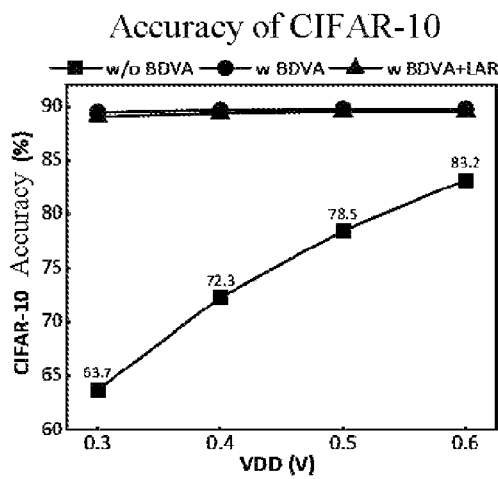
Figure 14D:
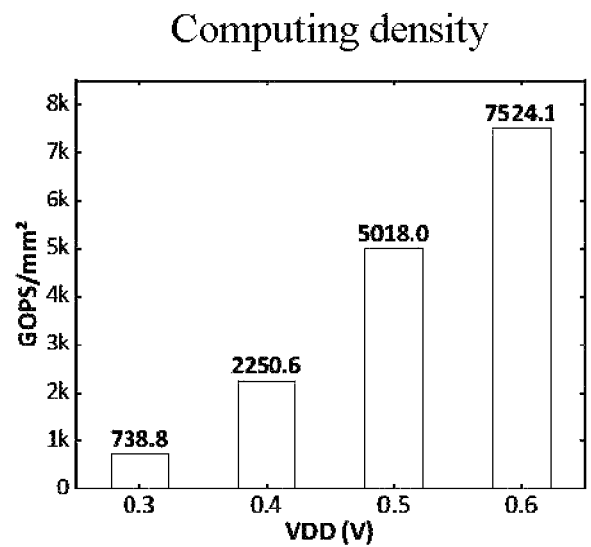
Figure 14E:
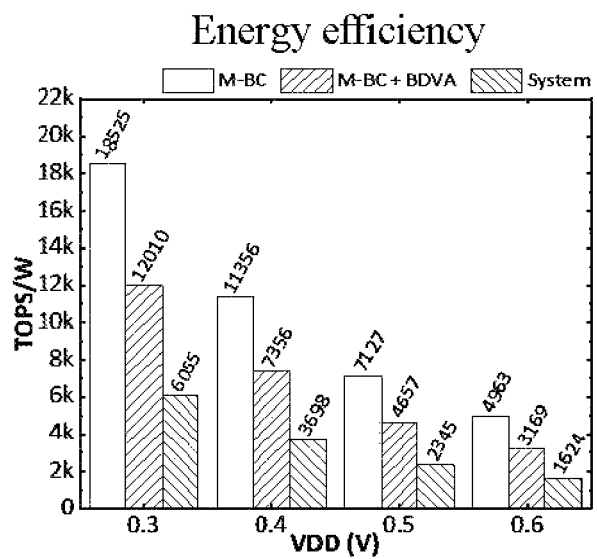

FIGS. 14A-14E show a measurement result of a binary neural network accelerator test chip fabricated by a 55 nm CMOS process for 4 Kb in-memory computation. The chip may operate reliably at the power of 0.3-0.6 v, with power consumption of 2.4-91.5 uW at the frequency of 12.17-129.4 MHz, as shown in FIG. 14A. When the minimum supply voltage is 0.3 V, M-BC dominates in the total power consumption of the CIM-BNN design (64.3%), as shown in FIG. 14B, whereas the power consumption is reduced to 32.2% in the design of a binary neural network accelerator for in-memory computation according to the present disclosure. Since the proposed power saving multiplied bit unit and lazy accumulated bit line are reset, the overall power consumption can be reduced by 1.9X. FIG. 14C shows the inferential accuracy of a test chip when implemented with VGG-16 and tested with CIFAR-10. While conventional batch standardized comparators suffer a significant inference accuracy loss upon voltage scaling, the test chip of the present disclosure exhibits the minimal inference accuracy loss in the proposed BDVA pre-amplification scheme. Energy is additionally reduced by 1.47× and 1.63× at 0.3 V and 0.6 V, respectively, with the inference accuracy losses of 0.4% and 0.2%, respectively, when lazy accumulated bit line resets are further adopted. FIGS. 14D and 14E show relationships between computing density and energy efficiency indexes and VDD (0.3-0.6 v): 0.74-7.52 TOPS/mm2 and 6.06-1.62 POPS/W, respectively.

FIG. 15 summarizes the comparison of this study with the prior art. The present disclosure implements a binary neural network accelerator for 4 Kb in-memory computation in the 55 nm CMOS process, and the scalable supply voltage may be reduced to 0.3 V. A binarized VGG-16 model is implemented by using the accelerator, and the test accuracy on CIFAR-10 is 89.1%. The binary neural network accelerator based on in-memory computation achieves peak energy efficiency of 18.5 POPS/W and 6.06 POPS/W, which are respectively improved by about 21× and 135× compared with previous macro module and system studies [9, 11].

What is claimed is:

1. A high-energy-efficiency binary neural network accelerator applicable to an artificial intelligence Internet of Things, comprising:
a multiplication bit unit array, composed of L×L 10T1C (ten transistors one capacitor) multiplication bit units based on series capacitors, the 10T1C multiplication bit units being configured to perform binary multiplication and accumulation operations in one clock cycle and being composed of a 6T (six transistors) storage bit unit and a 4T1C (four transistors one capacitor) memory XNOR (exclusive-NOR) logical unit, wherein the 6T storage bit unit is configured to store weight values W and WB, W is a weight value of a neural network obtained by pre-training, and WB is a bar signal of W;
the 4T1C memory XNOR logical unit realizes XNOR logic between input activation values F and FB and the weights W and WB stored in the 6T storage bit unit;
a capacitor in the 4T1C memory XNOR logical unit is connected in series to an accumulated bit line ABL;
a multiplication result directly generates a final convolution result on the accumulated bit line ABL through a charge distribution of the capacitor of the 4T1C memory XNOR logical unit, F is a binary value of the input activation value, and FB is a bar signal of F; and
a voltage amplification array with a size of 20×L, wherein each column is designed with 20 low-voltage amplification units, and only one low-voltage amplification unit is selected from each column of the 20 low-voltage amplification units for an amplification according to a pre-trained binary batch standardized bias coefficient α; and an output voltage of the selected low-voltage amplification unit approaches ½ positive supply voltage VDD to ensure that a maximum voltage gain is obtained for each low-voltage amplification unit.

2. The high-energy-efficiency binary neural network accelerator applicable to the artificial intelligence Internet of Things according to claim 1, wherein the 10T1C multiplication bit unit adopts a multiple threshold voltage (VT) design strategy to overcome a positive channel metal oxide semiconductor (PMOS)/negative channel metal oxide semiconductor (NMOS) skew at a low voltage.

3. The high-energy-efficiency binary neural network accelerator applicable to the artificial intelligence Internet of Things according to claim 2, wherein a PMOS transistor used in the 6T storage bit unit is a low threshold voltage (LVT) and an NMOS transistor is a high threshold voltage (HVT).

4. The high-energy-efficiency binary neural network accelerator applicable to the artificial intelligence Internet of Things according to claim 1, wherein all transistors of the 10T1C multiplication bit unit adopt a gate length bias technology to reduce an influence of device mismatch and adopt an adaptive body bias technology to reduce a device deviation.

5. The high-energy-efficiency binary neural network accelerator applicable to the artificial intelligence Internet of Things according to claim 1, wherein the capacitors of the 4T1C memory XNOR logical unit are realized by metal-oxide-metal (MOM) capacitors of a high-level interdigitated metal.

6. The high-energy-efficiency binary neural network accelerator applicable to the artificial intelligence Internet of Things according to claim 1, wherein the voltage amplification array realizes the amplification based on the following steps:
1) Selecting a low-voltage amplification unit with a maximum gain from each column of the 20 low-voltage amplification units according to the bias coefficient α;
2) Converting the bias coefficient α into an analog voltage value V1 through a digital-to-analog converter (DAC) unit to an input end of the low-voltage amplification unit selected in the previous step, an output voltage V1' of the low-voltage amplification unit being sampled and held by using a first sampling capacitor;
3) Sending an analog voltage value V2 on the accumulated bit line ABL to the input end of the same low-voltage amplification unit in step 2), an output voltage V2' of the low-voltage amplification unit being sampled and held by using a second sampling capacitor; and
4) Obtaining a correct comparison result, i.e. a batch standardized result, by comparing voltages output by two first sampling capacitors and the second sampling capacitor through a low-voltage comparator since V2'-V1'>>V2-V1.

7. The high-energy-efficiency binary neural network accelerator applicable to the artificial intelligence Internet of Things according to claim 6, wherein a step of determining an optimal body bias voltage of all the selected low-voltage amplification units by a body bias voltage computing circuit comprises the following steps:
a) respectively inputting an equal interval scanning voltage of 1/21 VDD to 20/21 VDD into the 20 low-voltage amplification units, which are pre-adjusted in size, one by one for each column of the low-voltage amplification units;
b) continuously comparing output results of the 20 low-voltage amplification units with input values of 1/21VDD to 20/21VDD with a reference voltage of 1/2 VDD through an operational amplifier OPA, performing a body bias on all NMOS transistors of the current low-voltage amplification unit in a closed-loop manner by an output of the operational amplifier OPA, further digitizing an output body bias voltage by a 6-bit SAR analog-to-digital converter (ADC) unit to obtain a body bias digital code of the current low-voltage amplification unit, and storing the body bias digital code in a 6-bit register corresponding to each low-voltage amplification unit; and c) after selecting a low-voltage amplification unit with the maximum gain from each column of the 20 low-voltage amplification units according to the bias coefficient α, taking out the body bias digital code corresponding to the selected low-voltage amplification unit from the register, restoring the body bias digital code to an analog value through the DAC unit, and inputting the analog value to a body bias node of the NMOS transistor of the corresponding low-voltage amplification unit, thus starting to perform a voltage amplification on the bias coefficient α and the accumulated bit line ABL.

8. The high-energy-efficiency binary neural network accelerator applicable to the artificial intelligence Internet of Things according to claim 7, wherein the DAC unit is a 5-bit auxiliary DAC unit and a 6-bit high-accuracy DAC unit based on a capacitor array, the 5-bit auxiliary DAC unit pre-charges parasitic capacitors of an input node and a body bias node of the low voltage amplification unit to generate a roughly estimated analog voltage, and the 6-bit high-accuracy DAC unit generates an accurate analog voltage on this basis.

9. The high-energy-efficiency binary neural network accelerator applicable to the artificial intelligence Internet of Things according to claim 7, wherein the accumulated bit line ABL adopts a lazy accumulated bit line reset scheme which sets a reset interval N according to different supply voltages and a size of a convolution kernel adopted by a neural network, and a reset operation of the accumulated bit line ABL is effective after an Nth convolution and batch standardized operation.

* * * * *